US012113336B2

(12) United States Patent
Fuentes et al.

(10) Patent No.: US 12,113,336 B2
(45) Date of Patent: Oct. 8, 2024

(54) ARRANGEMENT OF A BUSBAR ADAPTER WITH ONE OR MORE ELECTRO-MECHANICAL SWITCHING DEVICES

(71) Applicant: Eaton Intelligent Power Limited, Dublin (IE)

(72) Inventors: Bruno Fuentes, NRW (DE); Steffen Pluskotta, NRW (DE); Robin Küppers, Cologne (DE); Stephan Stanke, NRW (DE); Ingo Schaar, NRW (DE); Wolfgang Meid, Rheinland-Pfalz (DE)

(73) Assignee: EATON INTELLIGENT POWER LIMITED, Dublin (IE)

(*) Notice: Subject to any disclaimer, the term of this patent is extended or adjusted under 35 U.S.C. 154(b) by 218 days.

(21) Appl. No.: 17/757,417

(22) PCT Filed: Dec. 15, 2020

(86) PCT No.: PCT/EP2020/086297
§ 371 (c)(1),
(2) Date: Jun. 15, 2022

(87) PCT Pub. No.: WO2021/122653
PCT Pub. Date: Jun. 24, 2021

(65) Prior Publication Data
US 2023/0033407 A1    Feb. 2, 2023

(30) Foreign Application Priority Data

Dec. 20, 2019  (GB) .................................... 1919000
Aug. 7, 2020   (GB) .................................... 2012309

(51) Int. Cl.
H02B 1/052   (2006.01)
G01R 15/18   (2006.01)
H02H 7/22    (2006.01)

(52) U.S. Cl.
CPC ........... H02B 1/052 (2013.01); G01R 15/181 (2013.01); H02H 7/22 (2013.01)

(58) Field of Classification Search
CPC .... G01R 15/181; H02B 1/052; H02B 1/0565; H02B 1/20; H02B 1/21; H02H 7/22
See application file for complete search history.

(56) References Cited

U.S. PATENT DOCUMENTS 7,606,014 B2    10/2009  Ziegler et al.
2005/0077069 A1*  4/2005  Quero .................. H02B 1/32
                                              174/541

(Continued)

FOREIGN PATENT DOCUMENTS

DE   202018106893 U1   1/2019
EP       0455100 A2    11/1991

(Continued)

Primary Examiner — Jared Fureman
Assistant Examiner — Nicolas Bellido
(74) Attorney, Agent, or Firm — LEYDIG, VOIT & MAYER, LTD.

(57) ABSTRACT

A busbar adapter including a housing being adapted to be attached to a busbar, a printed circuit board, and at least one electric current sensor electrically connected with the printed circuit board, wherein the printed circuit board and the at least one electric current sensor are arranged inside the housing, wherein the housing comprises an upper housing part being adapted for the attachment of one or more devices to be connected through the busbar adapter to a busbar and a lower housing part being adapted for holding the printed circuit board and the at least one electric current sensor, and wherein the lower housing part comprises a first part being (Continued)

adapted for holding the printed circuit board and the at least one electric current sensor and a second part being adapted to be attached to the busbar.

11 Claims, 17 Drawing Sheets

(56) References Cited

U.S. PATENT DOCUMENTS

| | | | |
|---|---|---|---|
| 2007/0291433 A1* | 12/2007 | Ziegler | H02B 1/056 361/93.1 |
| 2015/0030111 A1 | 1/2015 | Nitsche et al. | |
| 2015/0244123 A1* | 8/2015 | Steinberger | H01R 25/145 439/119 |
| 2015/0357772 A1* | 12/2015 | Bruchmann | H01R 25/142 439/122 |
| 2022/0060001 A1* | 2/2022 | Bruchmann | G01R 15/181 |

FOREIGN PATENT DOCUMENTS

| | | | | |
|---|---|---|---|---|
| EP | 1045497 A2 * | 10/2000 | | H02B 1/0565 |
| EP | 4180885 A1 * | 5/2023 | | G05B 19/0428 |
| FR | 2967832 A1 | 5/2012 | | |
| WO | 99/19954 A1 | 4/1999 | | |
| WO | 2020/114579 A1 | 6/2020 | | |

\* cited by examiner

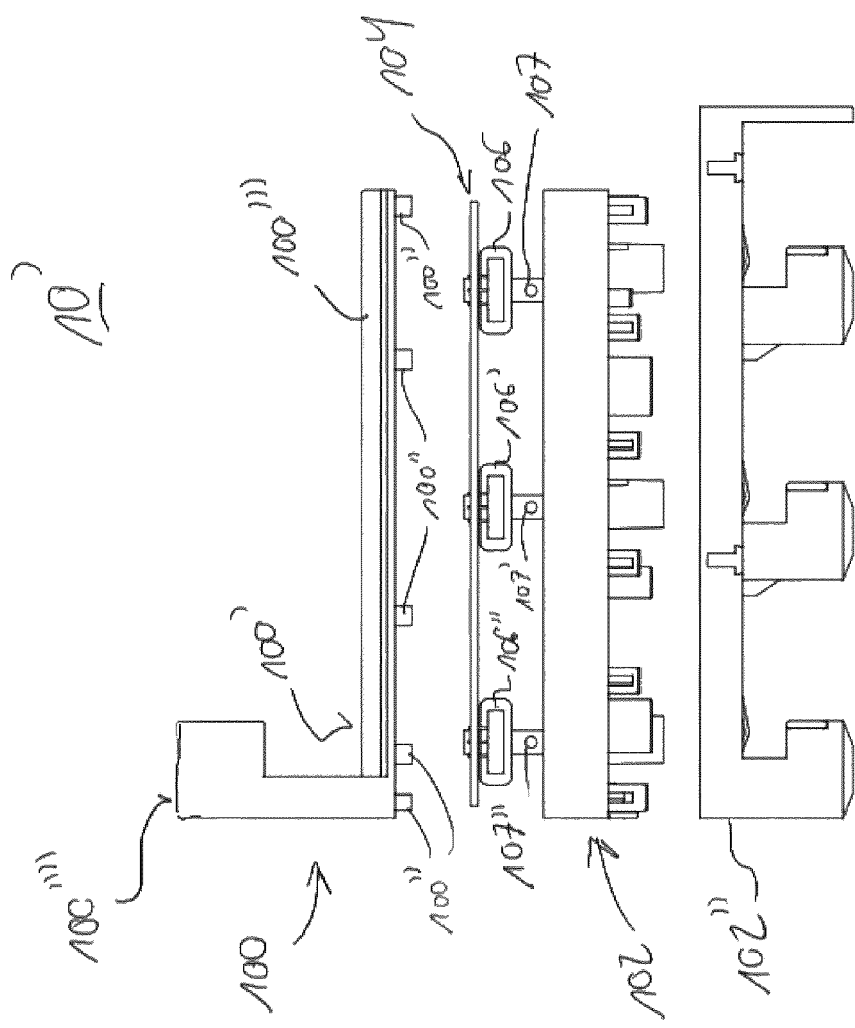

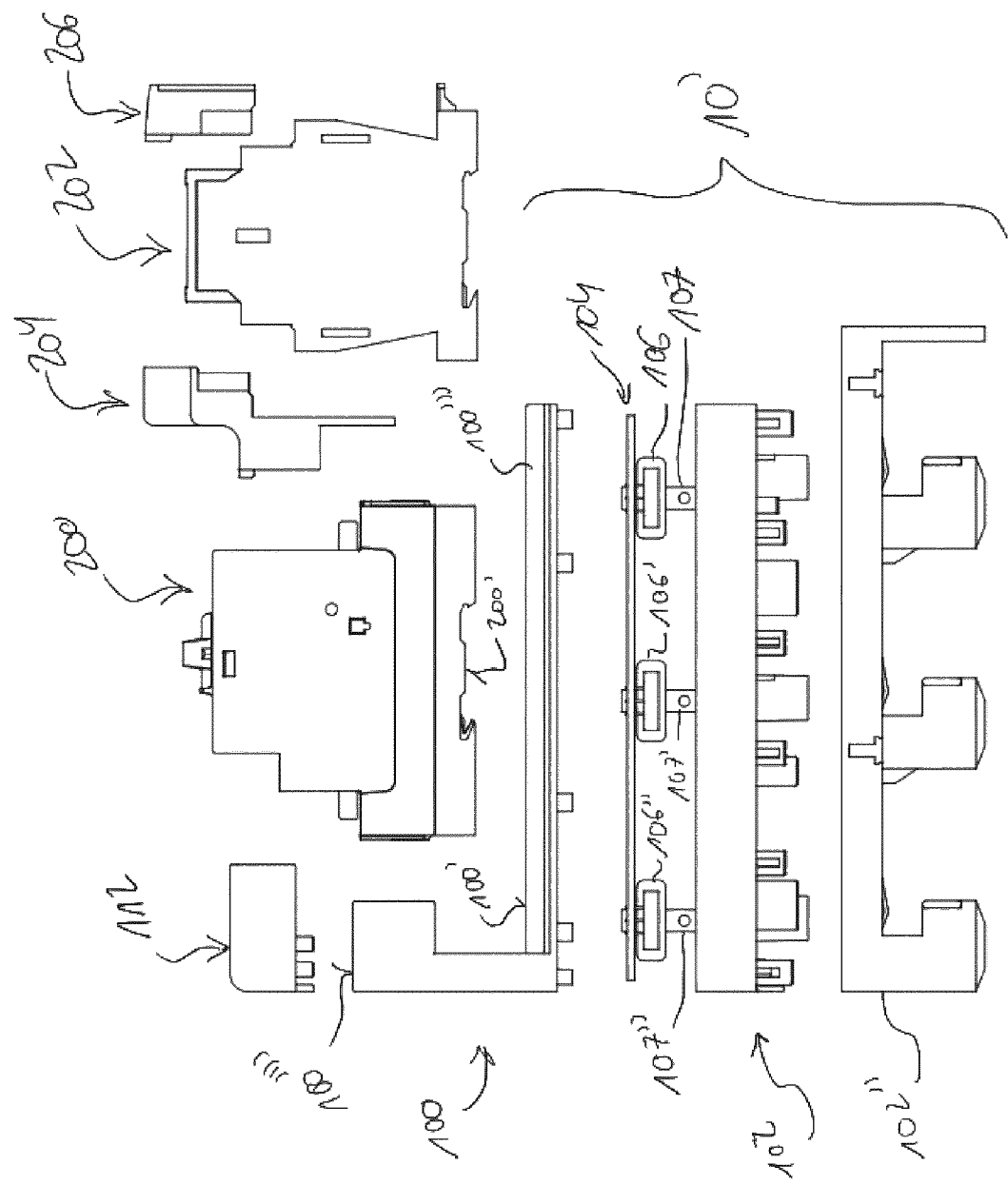

ARRANGEMENT OF A BUSBAR ADAPTER WITH ONE OR MORE ELECTRO-MECHANICAL SWITCHING DEVICES

TECHNICAL FIELD

This specification relates to a busbar adapter and an arrangement of this busbar adapter with one or more devices.

BACKGROUND

Busbar systems are used instead of specific electrical wirings for wiring electrical devices in electrical switch cabinets. The electrical devices to be wired are connected to the busbars with busbar adapters. An electrical device is mounted on an adapter, which is installed on a busbar carrying an electric current.

The European patent application EP 0 455 100 A2 discloses a busbar adapter comprising a housing and an electronic transformer being arranged inside the housing. The electronic transformer is at least partially immersed in the busbar and constructed from two circuit boards which are connected to one another in a T-shape.

The international patent application WO2020/114579A1 and the German utility model DE202018106893U1 relate to a busbar adapter for connection to a polyphase busbar system, wherein the busbar adapter comprises a top covering element and a bottom covering element and also contact apparatuses and contact lines. The busbar adapter further comprises a current measuring apparatus which is designed such that current measurement for each phase of the busbar adapter can be performed in the busbar adapter.

The US patent application US2015/0301111 A1 relates to a module for a fused switch arrangement, in particular for a fused switch arrangement for busbar systems. The module may take the form of a busbar adapter, which can be positioned on a busbar system, and to which in turn built-in devices, in particular rail-mounted devices, can be attached.

SUMMARY

This specification describes a busbar adapter and an arrangement of this busbar adapter with one or more electro-mechanical switching devices.

An aspect of this disclosure relates to a busbar adapter comprising a housing being adapted to be attached to a busbar, a printed circuit board, and at least one electric current sensor electrically connected with the printed circuit board, wherein the printed circuit board and the at least one electric current sensor are arranged inside the housing. The busbar adapter can be used for implementing different functions relating to electric current measurements such as power and energy metering and/or overcurrent protection. The printed circuit board may comprise electrical wiring for connecting the at least one current sensor with circuitry and/or one or more contactors. The housing comprises an upper housing part being adapted for the attachment of one or more devices to be connected through the busbar adapter to a busbar and a lower housing part being adapted for holding the printed circuit board and the at least one electric current sensor. A housing of the busbar adapter with at least two parts, the upper and the lower housing part, enables a modular approach of implementing the busbar adapter. Particularly, the busbar adapter may be adapted to be applied with different busbar systems by using respectively adapted lower housing parts, and for attachment of different devices by using respectively adapted upper housing parts. The lower housing part comprises a first part being adapted for holding the printed circuit board and the at least one electric current sensor and a second part being adapted to be attached to the busbar. This allows to apply also a modular concept of the lower housing part of the busbar adapter, and a versatile usage of the adapter with different busbar systems. For example, the first part may be implemented with the fixedly installed printed circuit board and the at least one current sensor, while the second part may comprise one or more connectors and means for attached the adapter to a certain busbar system. Thus, the busbar adapter may be adapted for using with different busbar system by replacing a suitable second part of the lower housing part.

The at least one electric current sensor may comprise a Rogowski coil, wherein the Rogowski coil is wrapped around an electrical conductor carrying an electric current from a bar of the busbar. The Rogowski coil may be arranged below, above, or besides the printed circuit board and hold by the board in a position in which the electrical conductor may be wrapped.

The housing may comprise a surface adapted for the attachment of one or more devices, for example switching devices, to be connected through the busbar adapter to a busbar. The surface may be for example dimensioned such that several devices, particularly switching devices, can be arranged side by side. Particularly, the surface may be adapted for the attachment of a motor starter combination of devices. For attachment of devices, the surface may comprise means for fixing the devices in a desired position, such as clamps and/or recesses for clamps and/or at least one rail. The at least one rail may be provided for attached one or more devices on the surface. On the surface, contacts may be provided for electrically connecting one or more electric contacts of the devices with one or more electrical conductors arranged inside the housing and provided for connecting the devices with one or more bars of the busbar.

The upper housing part may comprise one or more contacts being electrically connected to the busbar and being provided to be electrically connected to one or more respective contacts of a device being attached to the busbar adapter. Thus, no electrical wires may be guided from the lower housing part to one or more devices being attached to the upper housing part.

The busbar adapter may further comprise electronics being configured to implement one or more energy metering related functions based on the measurements made with the at least one electric current sensor. The electronics may for example comprise a dedicated circuitry and/or a processor or microcontroller, which are configured by software such as a firmware to implement the one or more energy metering related functions. The one or more energy metering related functions implemented by the electronics may comprise generating data, particularly power and energy data from the measurements made with the at least one electric current sensor and providing the data for further processing. For generating power and energy data, also a voltage measurement may be made, particularly within the busbar adapter. Furthermore, the electronics may comprise a wired and/or wireless interface for providing the data, particularly the power and energy data to external devices. The electronics may comprise a controller for processing the data such as the power and energy data, particularly for analyzing and/or evaluating the power and energy data. The controller may be particularly configured to detect an overload condition and/or a short circuit from the processing of the data and to generate a signal for activating a protection device depending on the detection of an overload condition or a short circuit. For example, the controller may generate in case of a detected short circuit a signal to activate a motor starter protection device.

Another aspect of this disclosure relates to an electric device, particularly an electric switching device, being adapted to be attached to a busbar adapter as disclosed herein, wherein the device comprises means for fastening the device on a surface, particularly on at least one rail provided on the surface and at least one of the following: an undervoltage release; a shunt current release; an auxiliary switch. Further functionality may be implemented in the device depending on the application.

Further aspects of this disclosure relate to arrangements comprising a busbar adapter as disclosed herein and at least one device being attached to the busbar adapter for connecting to a busbar.

In the arrangement, a motor starter combination of devices may be attached to the busbar adapter.

The arrangement may particularly comprise a busbar adapter with an electronics comprising a controller for processing the data such as the power and energy data, particularly for analyzing and/or evaluating the power and energy data, and a relay being controlled by the controller depending on the processing of the data, wherein the controller is configured to detect an overload condition and/or a short circuit from the processing of the data and to activate the relay in case of a detected overload condition or a detected short circuit. An overload condition and/or a short circuit may be particularly derived from electric current measurements made with the at least one electric current sensor. Alternatively or additionally, the electronics may also supply a signal for switching a relay, which may be attached to the busbar adapter. For example, when a short circuit is detected the electronics may supply a signal to a protection relay of a motor starter combination.

The details of one or more embodiments are set forth in the accompanying drawings and the description below. Other features and advantages will be apparent from the description and drawings, and from the claims.

DESCRIPTION OF DRAWINGS

FIG. 4 shows an exploded side view of a second embodiment of a busbar adapter;

FIG. 5A shows an exploded side view of an embodiment of an arrangement of the busbar adapter of FIG. 4 with a motor starter combination of switching devices for attachment on a surface of the busbar adapter and FIG. 5B shows the arrangement of FIG. 5A in an exploded perspective view;

DETAILED DESCRIPTION

Figure 1:
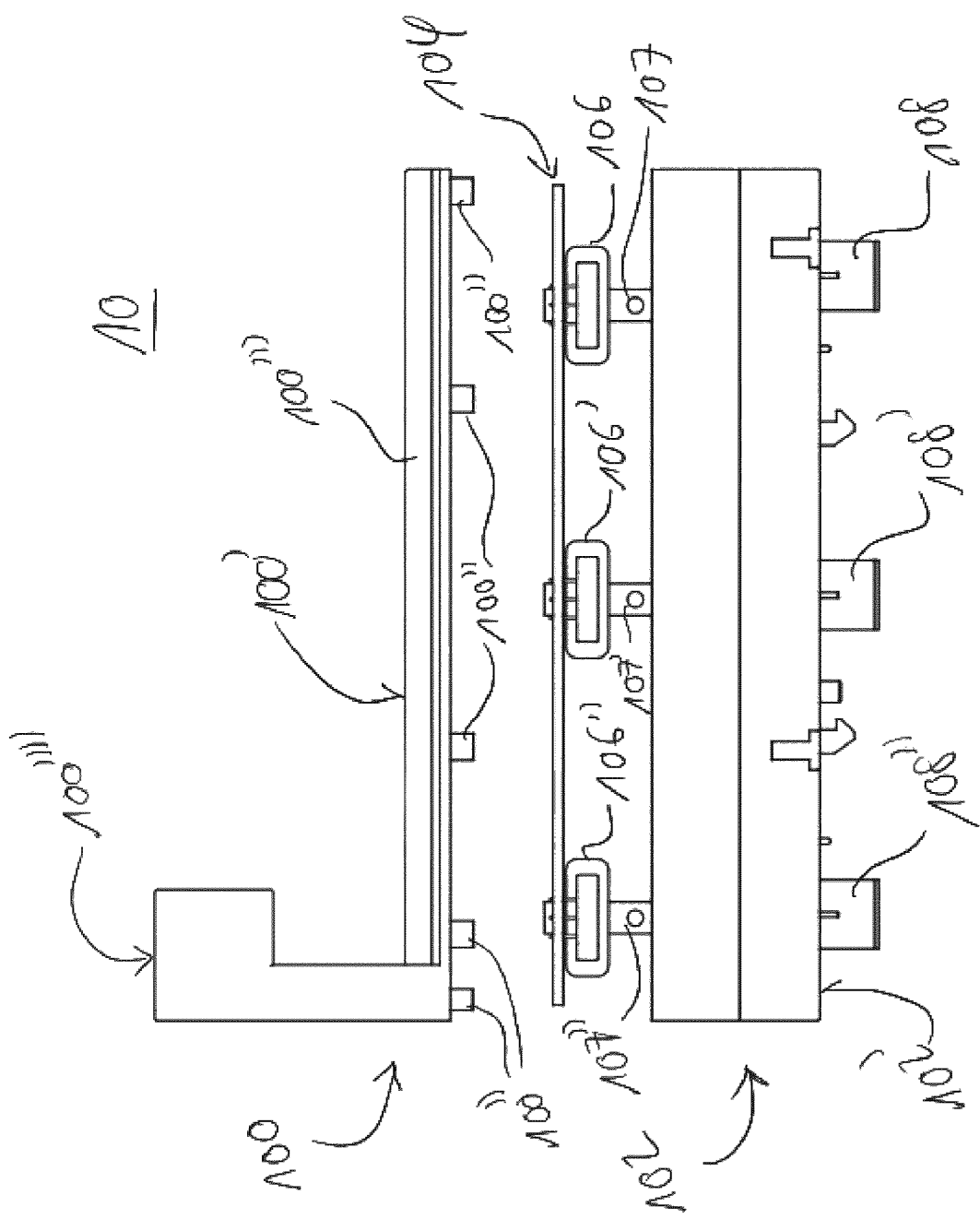
FIG. 1 shows an exploded side view of a first embodiment of a busbar adapter.

In the following, functionally similar or identical elements may have the same reference numerals. Absolute values are shown below by way of example only and should not be construed as limiting.

FIG. 1 shows in an exploded side view a busbar adapter 10 for connecting several devices such as a motor starter combination of devices to a busbar.

The adapter 10 has a housing comprising an upper part 100 and a lower part 102. The upper housing part 100 comprises a surface 100', on which at least one device may be attached. On its bottom side, the upper housing part 100 comprises several protrusions 100" for clipping the part 100 on the part 102. One or more rails 100''' may be provided on the surface 100' for fixing an attached device so that the device can only be moved along the one or more rails 100'''. On the left side of the upper housing part 100, a structure 100'''' in the form an upside-down L is provided for housing one or more contacts of a wired interface and/or electric contacts for contacting devices attached to the busbar adapter 10 with busbar adapter internal electric conductors 107-107".

The lower housing part 102 can be attached to a further housing part 102', which forms a kind of connector part for connecting the entire busbar adapter 10 to a busbar. The further housing part 102' may also be replaced with another housing part 102" (FIG. 4) in order to attach the busbar adapter to another busbar system. Thus, the busbar adapter can be used with busbar system from different manufacturers by replacing the housing part 102', 102", which is the housing part adapted for attachment to a certain busbar system.

The lower housing part 102 has a cuboid like shape and is dimensioned for housing a printed circuit board 104 and Rogowski coils 106, 106', 106" electrically connected to the board 104 at its bottom side. The coils 106-106" serve as electric current sensors for measuring the electric currents carried by the internal electric conductors 107, 107', 107" from a bar of the busbar. Instead of Rogowski coils, also other electric current sensors may be employed, such as current transformers or magnetic field sensors like a Hall effect sensor, a flux gate sensor, or a magneto-resistive current sensor. Each of the conductors 107-107" ends at the bottom side 102' of the lower housing part 102 in a connector contact 108, 108', 108", respectively, each of which is provided for contacting a bar of a busbar when the adapter 10 is attached to that busbar.

Particularly the lower part housing 102 and/or the structure 100'''' may also house electronics (not shown) being configured to implement one or more energy metering related functions based on the measurements made with the current sensors 106-106". The electronics may comprise an integrated circuitry, such as a processor or microcontroller, configured to implement the energy metering function, for example by a firmware. An energy metering function may be particularly implemented to generate power and energy data from the measurements made with the electric current sensors 106-106" and to provide the power and energy data for further processing either by the electronics itself or externally. For generating power and energy data, an electric voltage measurement may be performed. For example, a voltage tap on/to the printed circuit board 104 with a safe separation may be provided for performing the voltage measurement per electric phase.

Furthermore, one or more temperature sensors may be provided, particularly arranged on the printed circuit board 104. Measurement data from the one or more temperature sensors may then be processed by the electronics or provided via an interface to external devices for further processing. The temperature measurements may be processed to implement an overload condition detection, for example when a temperature signals an overload current condition. Also, protection functions could be implemented based on the temperature measurements, for example to activate a protection device such as a circuit breaker to electrically disconnect the busbar adapter from one or more busbars.

A further protection function may be implemented by detecting a short circuit, particularly by monitoring the measured electric currents carried by the internal electric conductors 107, 107', 107" from a bar of the busbar. When a measured electric current exceeds a predefined threshold, an internal signal may be generated, which can be used to activate a protection device such as a motor protection device of a motor starter combination attached to the busbar adapter. Also, the temperature measurements may be processed to implement a short circuit detection, for example when the temperature signals a possible short circuit due to an increased temperature within the busbar adapter caused by a high electric current, which may be typical for a short circuit for example in a motor winding.

The electronics may also implement a wired and/or a wireless interface for providing the power and energy data to external devices. The interface may comprise for example a Bluetooth®, ZigBee™, Wi-Fi™, NFC (Near Field Communication) or any other kind of wireless data interface and/or an Ethernet interface, USB (Universal Serial Bus) interface or any other kind of wired data interface for providing the power and energy data to external devices.

Figure 2A:
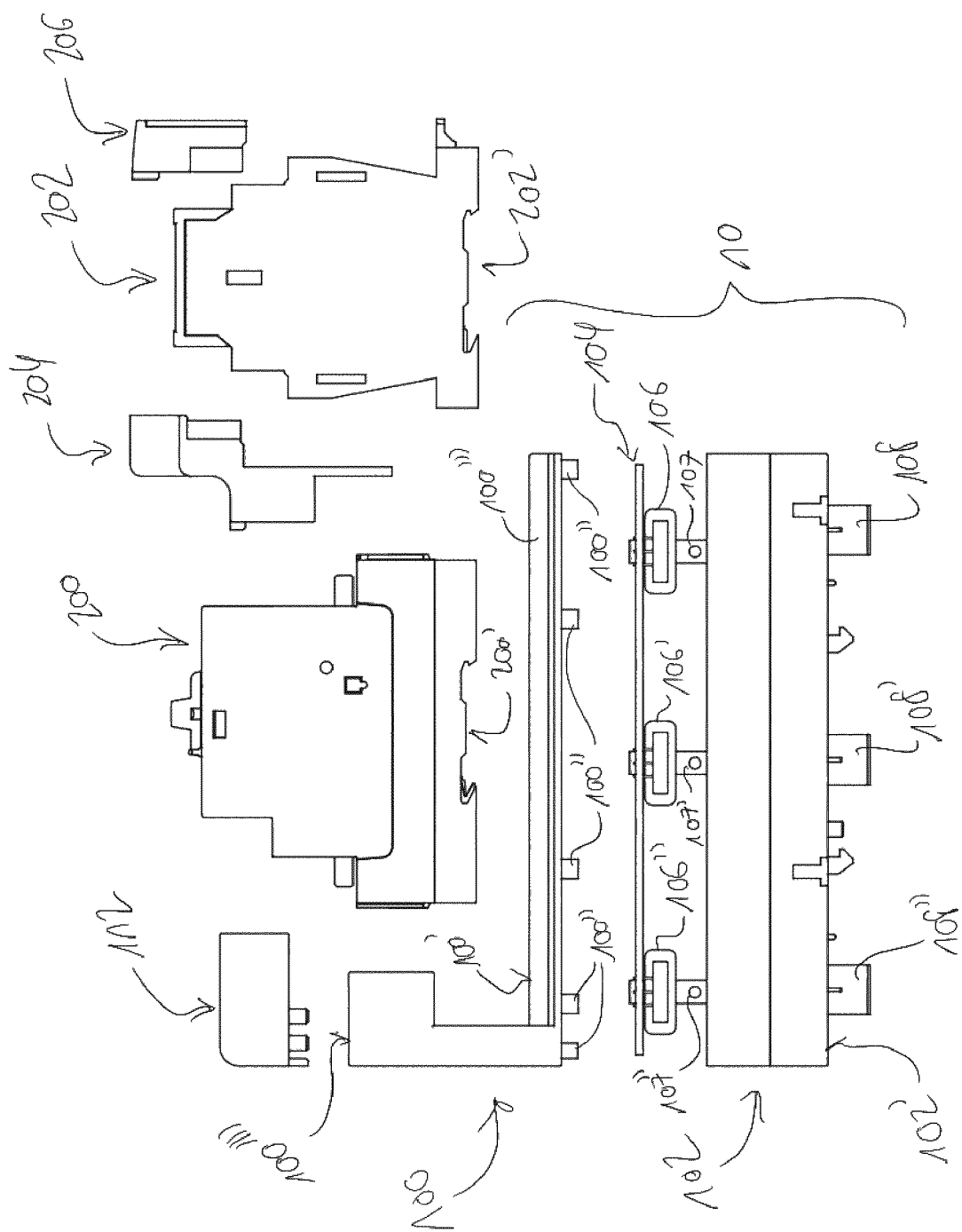
FIG. 2A shows an exploded side view of an embodiment of an arrangement of the busbar adapter of FIG. 1 with a motor starter combination of switching devices for attachment on a surface of the busbar adapter and FIG. 2B shows the arrangement of FIG. 2A in an exploded perspective view.
Figure 2B:
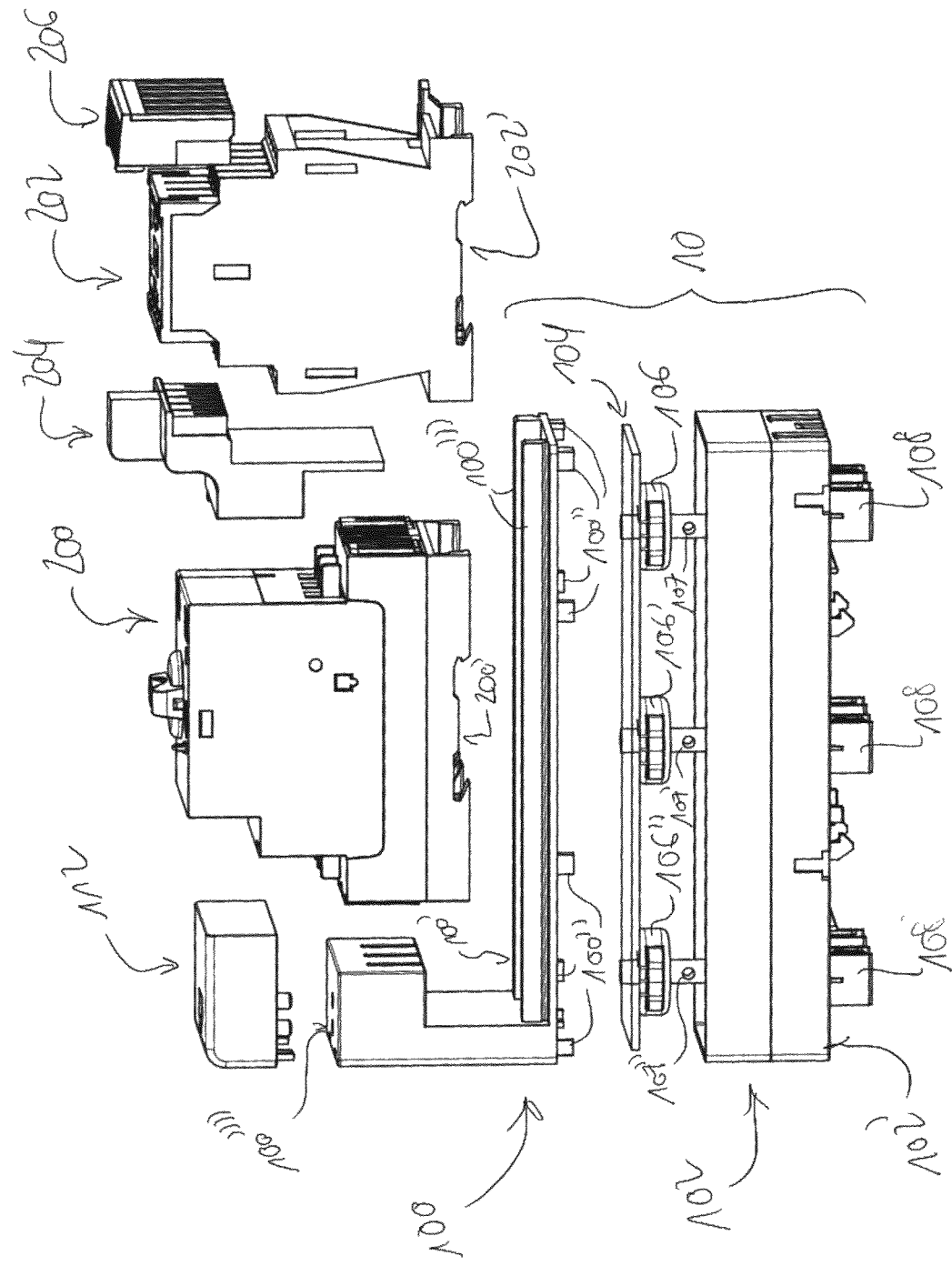

FIG. 2A shows in an exploded side view of an arrangement of the busbar adapter 10 and devices 200, 202, 204 and 206 of a motor starter combination and an interface device 112. FIG. 2B is a perspective view of the arrangement of FIG. 2A.

The devices 200 and 202 may be for example the components of a motor starter combination MSC-D of Eaton Corp. Device 200 may be for example a standard device PKZM0 from Eaton Corp. and device 202 may be for example a contactor DIL from Eaton Corp. However, other combinations may be also attached to the busbar adapter.

The devices 200 and 202 can be attached to the surface 100' of the upper housing part 100. Both devices 200 and 202 may be pushed on the rails 100''' on the surface 100' so that they can only be moved along the rails 100''' (from left to right and vice versa in FIG. 1B). The devices 200 and 202 may comprise at the side, which is provided for attachment to the surface 100', means 200' and 202', respectively, for fixing the devices 200 and 202 to the rails 100''' such that the devices 200, 202 can only be removed from the rails 100''' by moving them along the rails 100''' to the right. The fastening of the device 202 on the rails 100''' can be better seen in the perspective side view of FIG. 3B. The structure 100'''' may comprise one or electrical connections to the device 200 and the internal wiring (not shown) of the busbar adapter 10. The structure 100'''' may also serve as stopper for the devices 200 and 202 slid on the rails 100'''.

On top of the structure 100'''', an interface device 112, which may for example comprise an Ethernet interface and/or an USB interface, can be attached and connected to the interface connectors of the busbar adapter 10 provided on top of the structure 100''''. Measurement data and/or control signal(s) may be transmitted via the interface device 112 to external devices, such as a computer configured for analyzing received measurement values and/or dedicated devices such as overcurrent protection devices.

A wiring device 204 electrically connects both devices 200 and 202 together and interconnects them to the motor starter combination. A connector device 206 can be attached to device 202 for providing connectors for wiring the motor start combination with one or more further devices. The connector device 206 may particularly comprise connecting terminals.

Figure 3A:
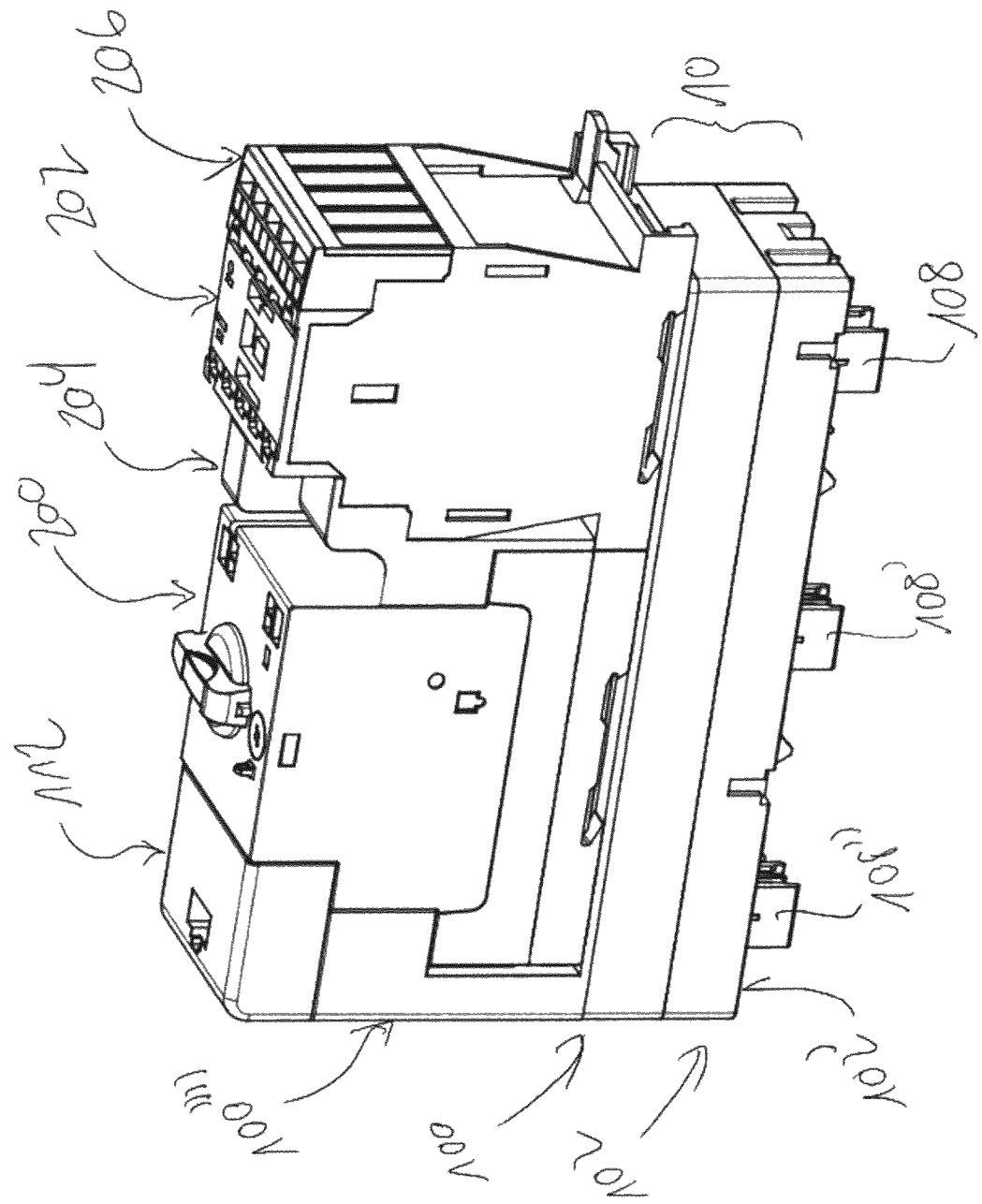
FIGS. 3A and 3B show the arrangement of FIGS. 2A and 2B with the motor starter combination of switching devices attached on the surface of the busbar adapter in perspective views.
Figure 3B:
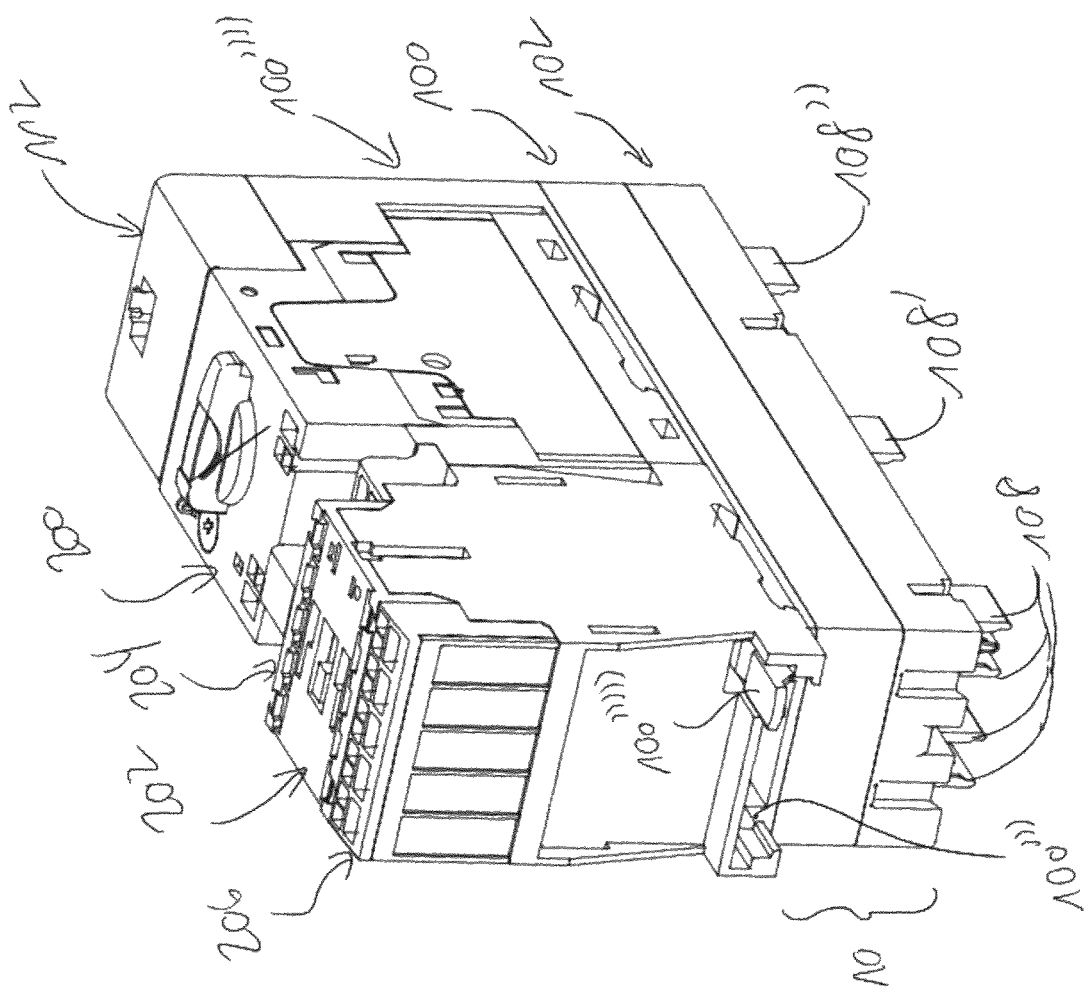

FIGS. 3A and 3B show the arrangement of FIGS. 2A and 2B in an assembled state, i.e. when the devices 200 and 202 are attached to and mounted on the surface of the busbar adapter 10. As can be seen, the device 200, for example a PKZM0 device, is slid on the rails 100''' provided on the surface 100' until it abuts on the structure 100''. Then, the second device 202, for example a contactor DIL, is slid on the rails 100''' until it abuts on the device 200.

The rails 100''' hold the slide-on devices 200 and 202 on the busbar adapter 10. A latch 100''''' can be provided at a rail 10''', as can be seen in FIG. 3B, which may prevent that the devices 200 and 202 slide-on the rails 100''' may easily slip down from the rails 100'''.

As can be seen in FIGS. 3A and 3B, the rails 100''' are in the assembled state at least partly covered by the (particularly electrically isolating) housings of the slide-on devices 200 and 202.

Figure 5B:
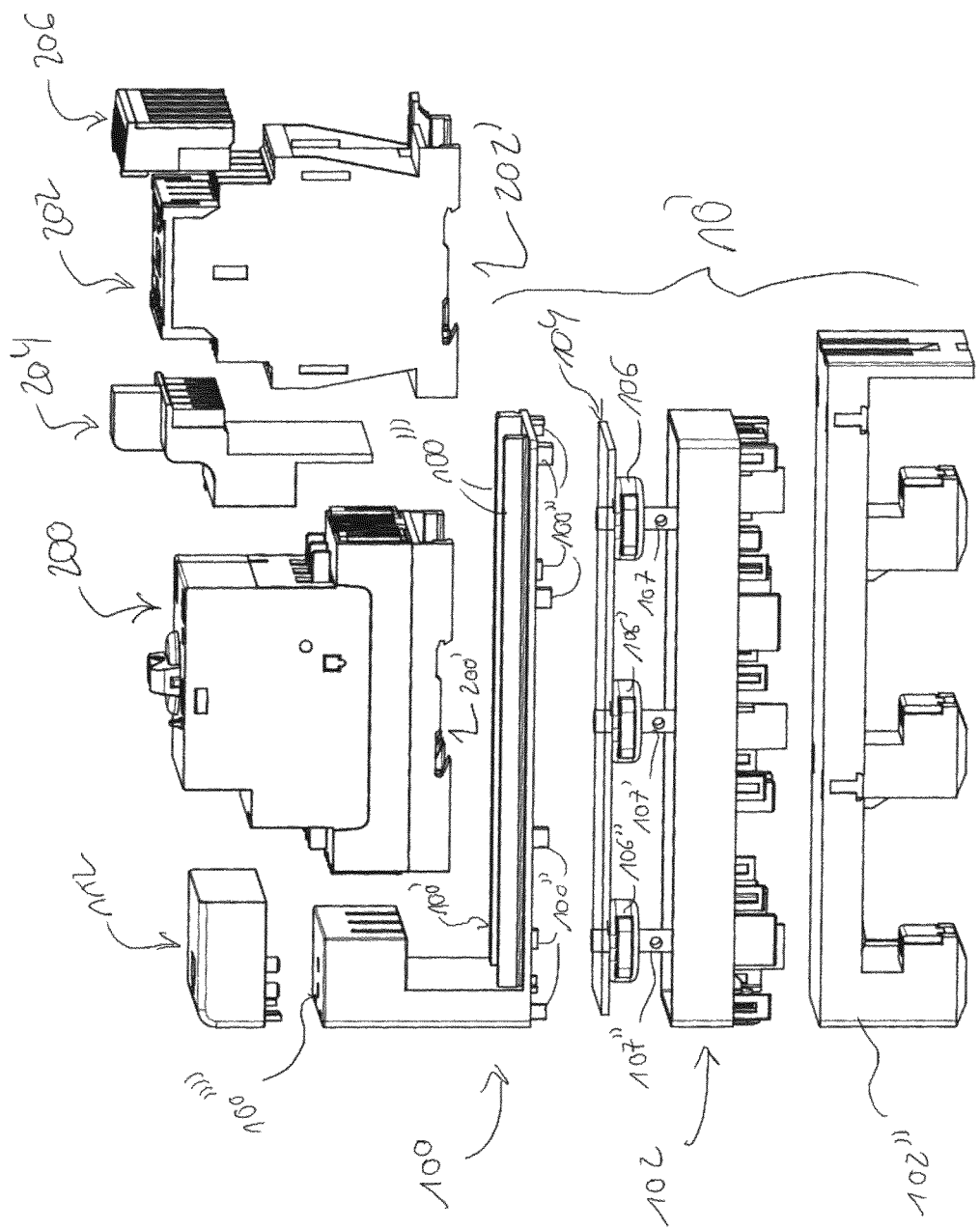
Figure 6A:
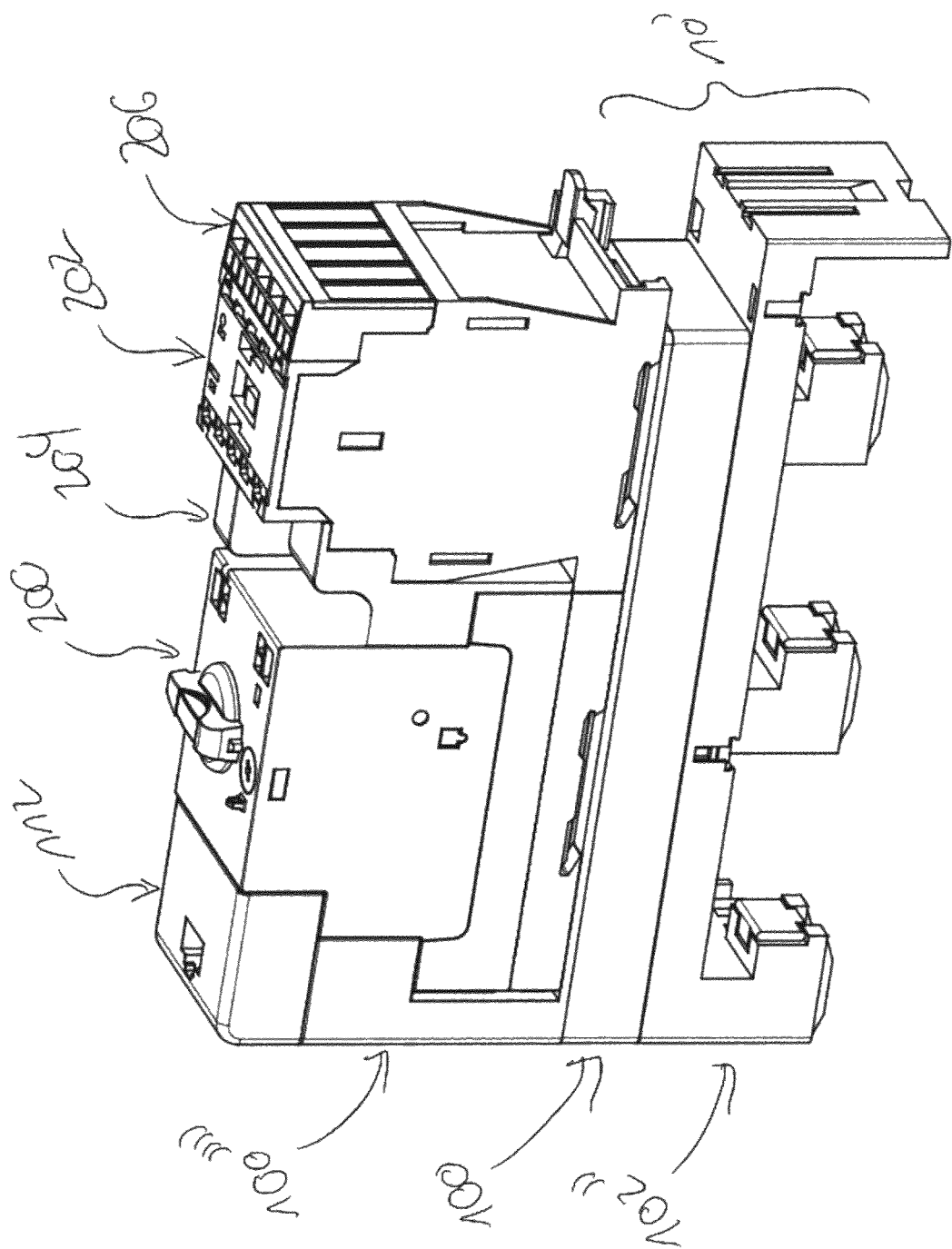
FIGS. 6A and 6B show the arrangement of FIGS. 5A and 5B with the motor starter combination of switching devices attached on the surface of the busbar adapter in perspective views.
Figure 6B:
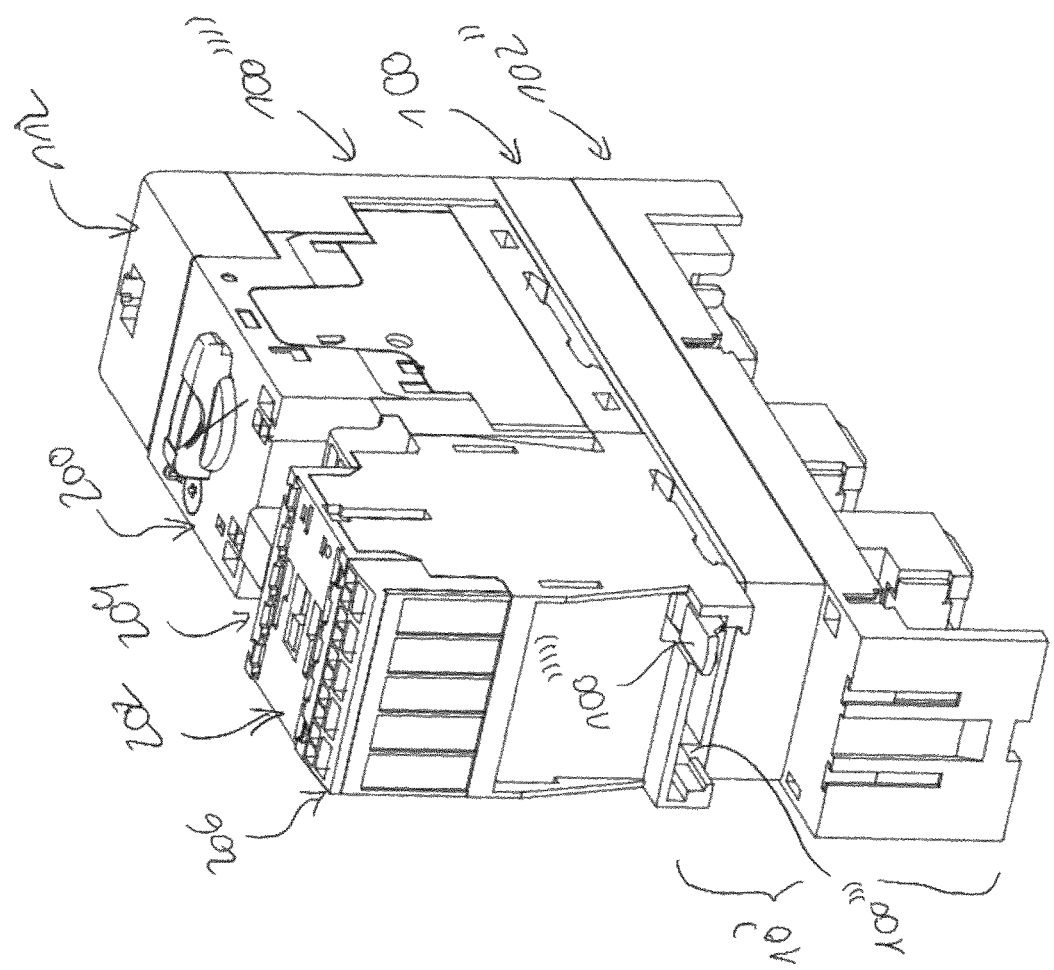

FIG. 4 shows another embodiment of a busbar adapter 10' in an exploded side view. FIGS. 5A and 5B show an arrangement of the busbar adapter 10' with a motor starter combination of switching devices for attachment on a surface of the busbar adapter in an exploded side view and an exploded perspective view, and FIGS. 6A and 6B show perspective view of the arrangement in an assembled state. The busbar adapter 10' differs from the busbar adapter 10 from FIG. 4 in that the lowest housing part 102" is adapted for attachment to a different busbar system.

Figure 7:
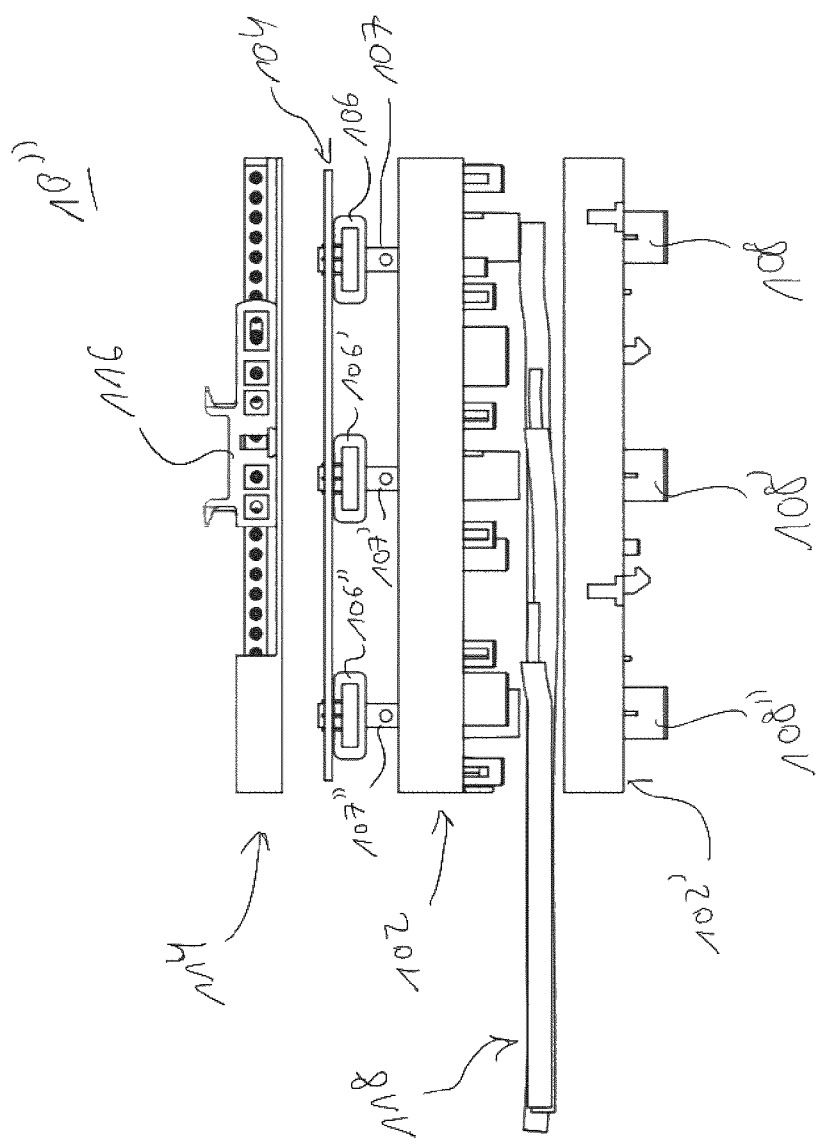
FIG. 7 shows an exploded side view of a third embodiment of a busbar adapter.
Figure 8A:
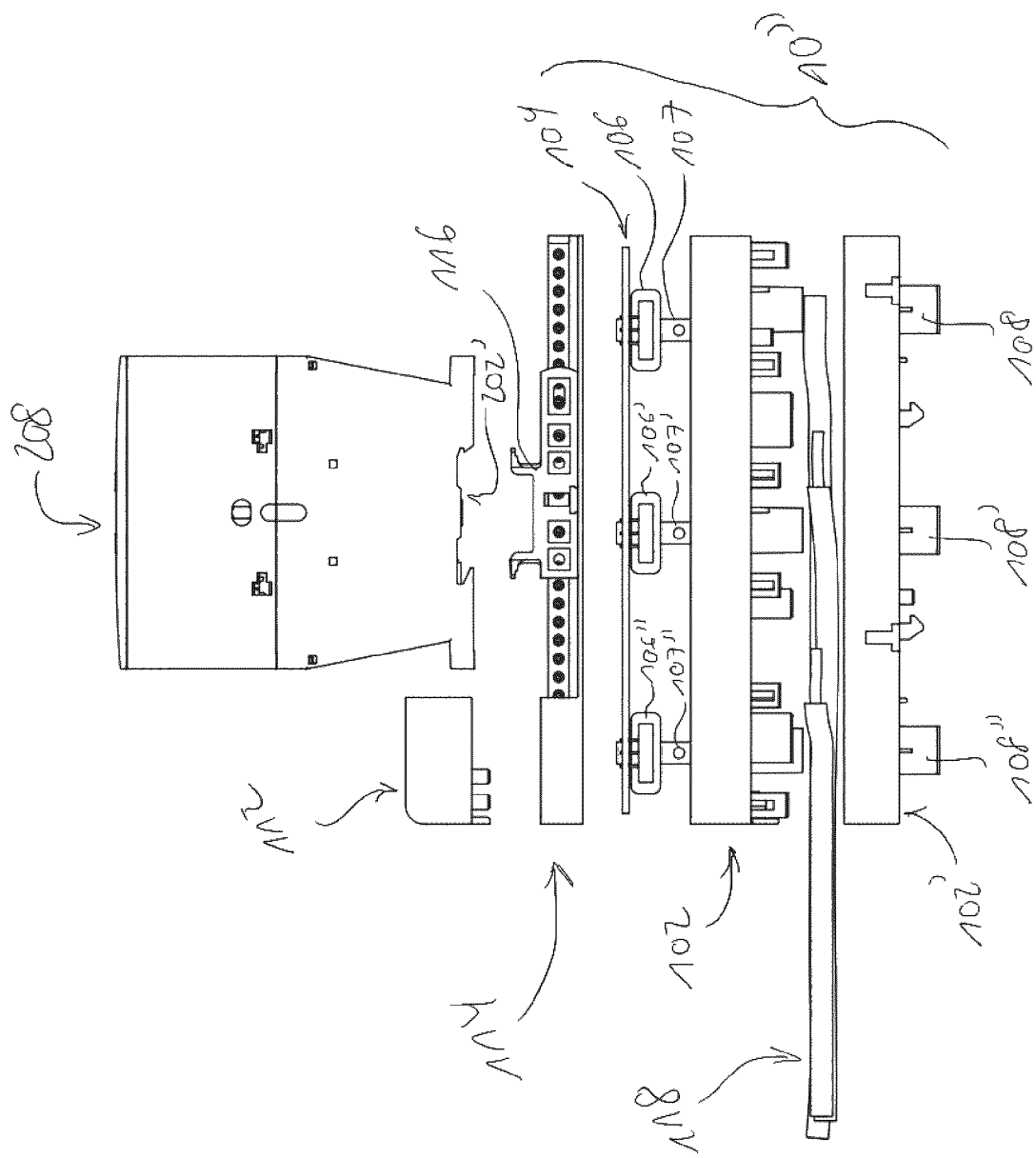
FIG. 8A shows an exploded side view of an embodiment of an arrangement of the busbar adapter of FIG. 7 with a switching device for attachment on a surface of the busbar adapter and FIG. 8B shows the arrangement of FIG. 8A in an exploded perspective view.
Figure 8B:
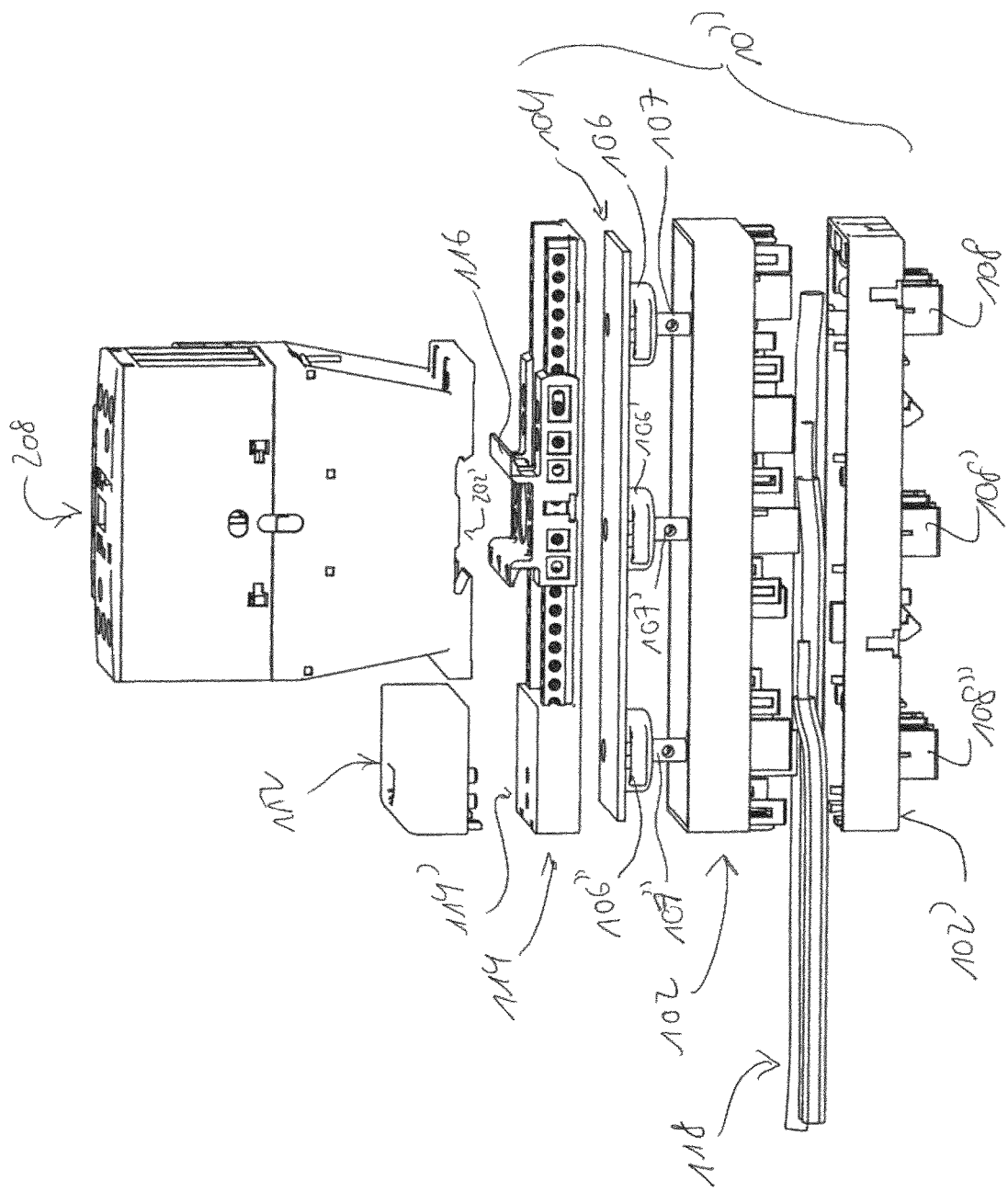

FIG. 7 shows a yet further embodiment of a busbar adapter 10" in an exploded side view. The busbar adapter 10" differs from the busbar adapter 10 in the upper housing part 114, which comprises a slidably attached top hat rail adapter 116. The top hat rail adapter 116 allows to attach standard switching devices 208 (FIGS. 8 and 9) with top hat rail fixing means to be attached to the busbar adapter 10".

The upper housing part 114 also comprises a wired interface 114' for connecting an interface adapter 112, for example an Ethernet interface adapter. The wired interface 114' may be connected internally to the printed circuit board 104 and the Rogowski coils 106, 106', 106" and/or to electronics (not shown), if provided and mounted on the board 104. Via the wired interface 114', data, for example measurement data from the Rogowski coils 106-106" may be provided for further processing. If electronics is comprised by the adapter 10", also data provided by the electronics, for example energy and power related data, may be provided via the interface 114'.

Figure 9A:
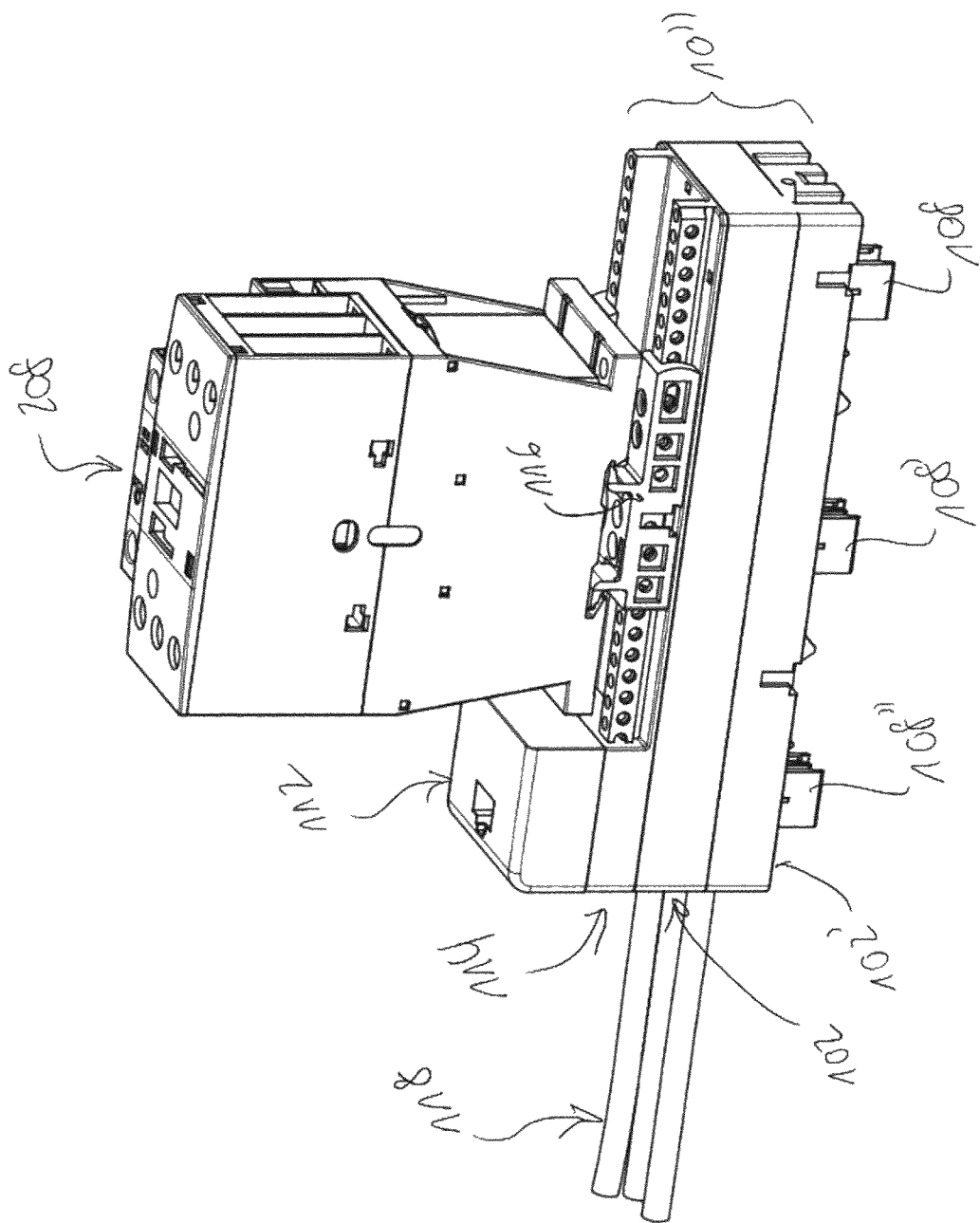
FIGS. 9A and 9B show the arrangement of FIGS. 8A and 8B with the switching device attached on the surface of the busbar adapter in perspective views.
Figure 9B:
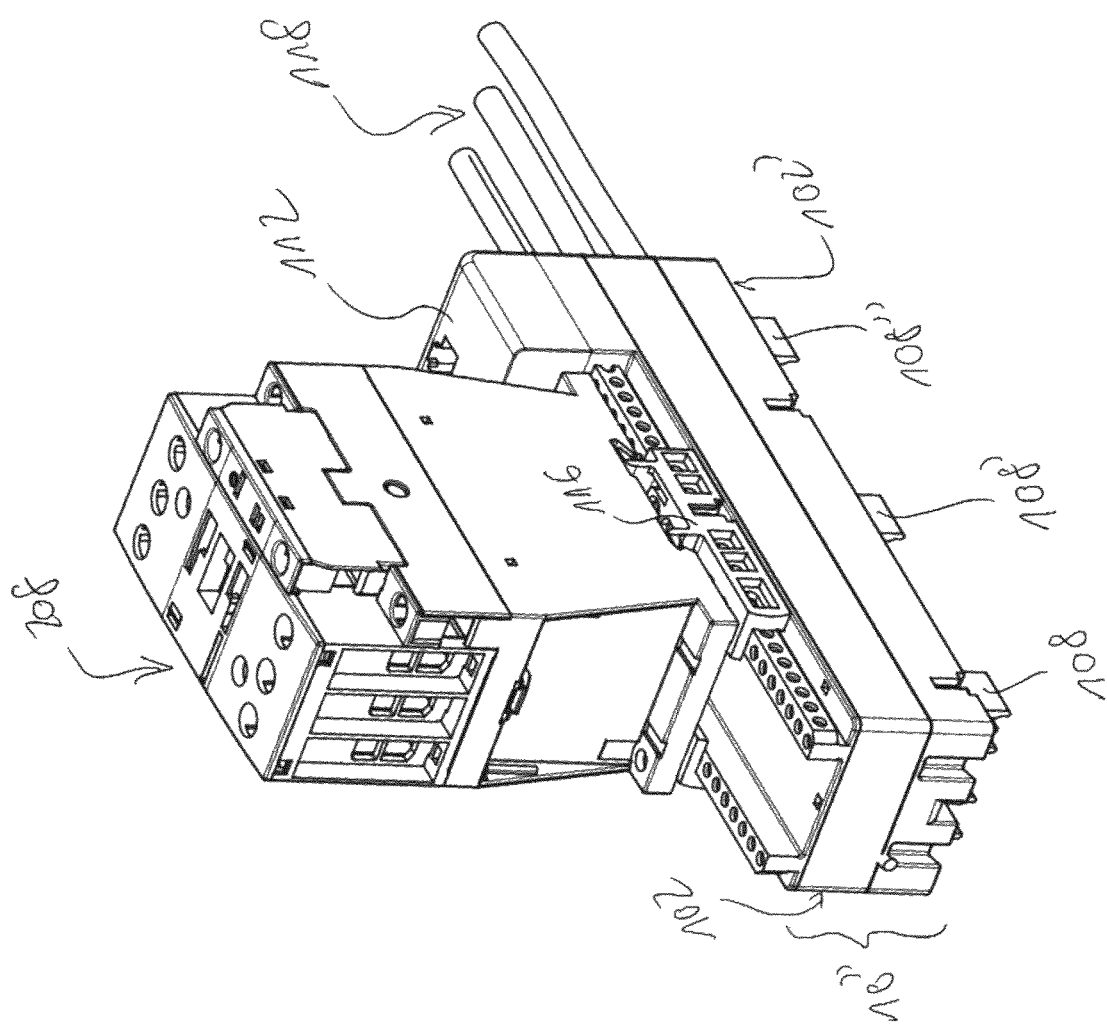

FIG. 7 shows the two lower housing parts 102 and 102' of the busbar adapter 10" in a disassembled state and electric wires 118, which are connected to the electric conductors 107, 107' and 107" to conduct the electric current from busbars. The electric wires 118 may be connected to one or more switching devices such as device 208 attached to the busbar adapter 10" and/or other switching devices. The electric wires 118 are guided through openings (not shown) at the side of the housing 102, 102' of the busbar adapter 10", as can be seen in FIGS. 9A and 9B, which show perspective views of an arrangement of the busbar adapter 10" and a switching device 208 attached to the adapter 10".

Figure 10A:
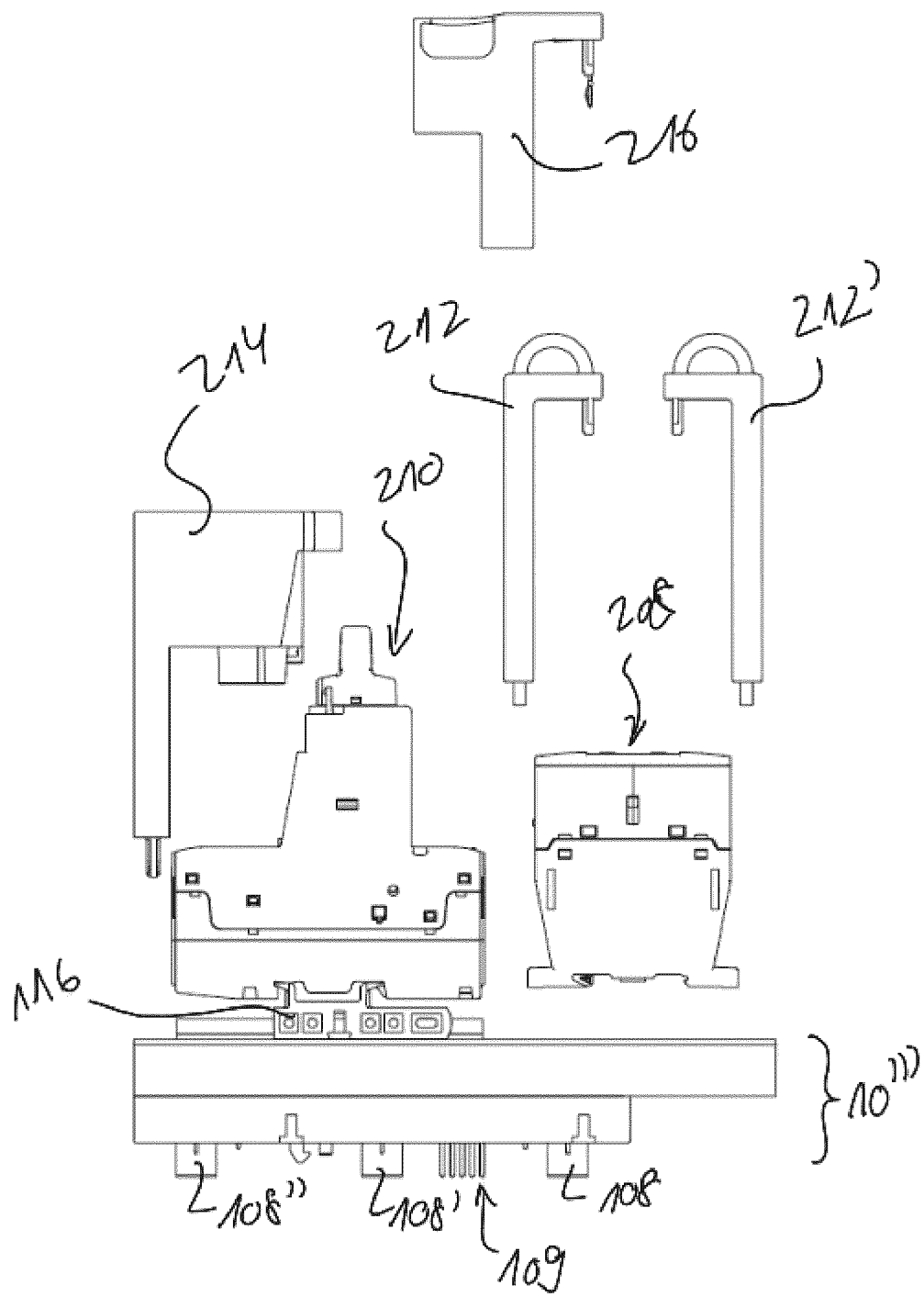
FIG. 10A shows an exploded side view of an embodiment of an arrangement of another embodiment of a busbar adapter with a motor starter combination of switching devices for attachment on a surface of the busbar adapter.

FIG. 10A shows an exploded side view of a further arrangement with a yet further embodiment of a busbar adapter 10'''. The arrangement comprises devices 208, 210, 212, 212', 214 and 216 of a motor starter combination.

Device 214 is a modular block, which may comprise internal conductors for supplying the device 210 with electric current from the internal electric rails of the busbar adapter 10''', and/or may comprise at least one of the following: one or more communication interfaces, particularly a wired and/or wireless interface; a display; an undervoltage release; a shunt current release; an auxiliary switch. Further functionality may be implemented in the device depending on the application. The devices 212, 212' are wiring modules for connecting the device 208 with connectors of the busbar adapter 10'''.

Figure 10B:
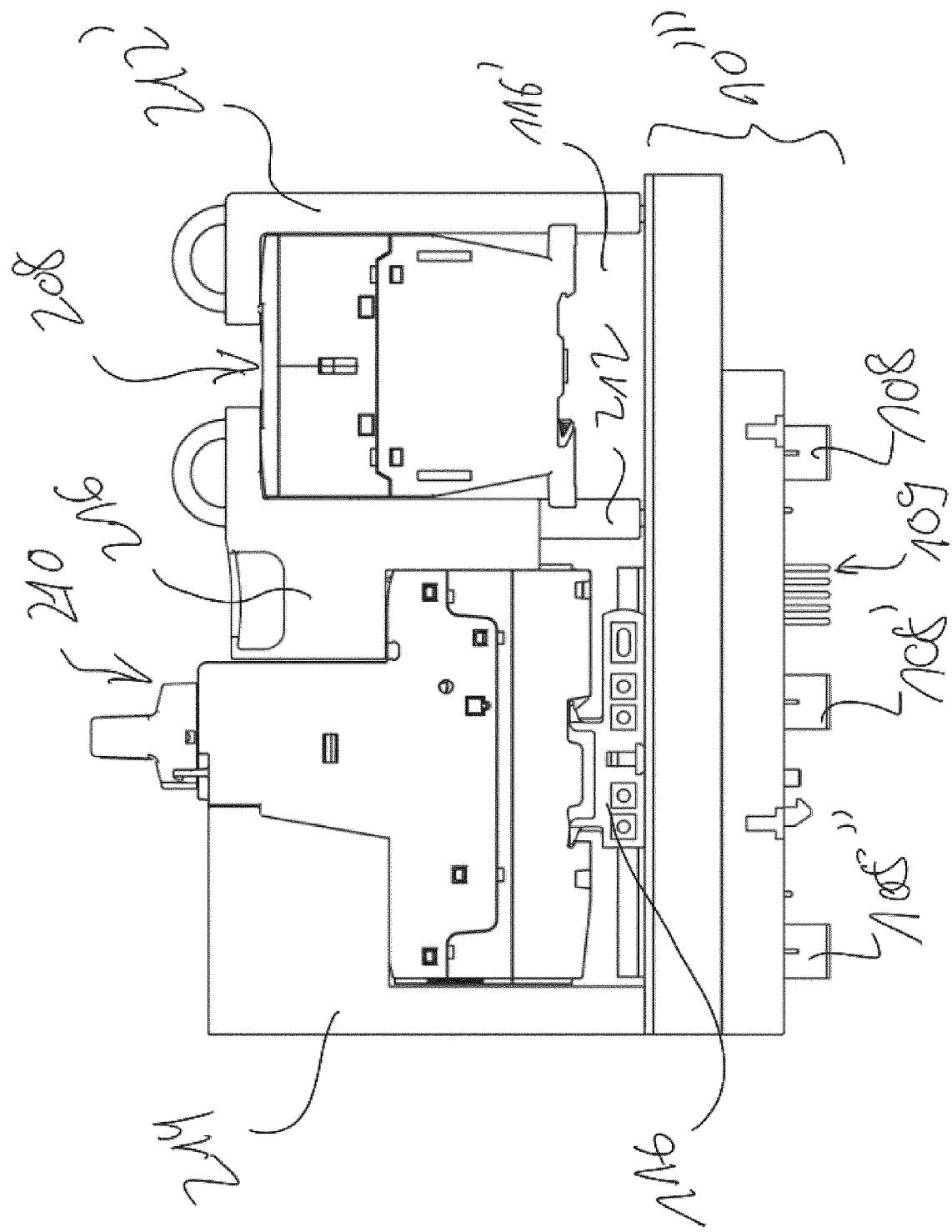
FIG. 10B shows the arrangement of FIG. 10A with the motor starter combination of switching devices attached on the surface of the busbar adapter in a side view.

The device 216 is also a wiring device for electrically connecting both devices 208 and 210 together and to interconnect them to the motor start combination. The device 210 is attached to the busbar adapter 10''' via a top hat rail adapter 116. The device 208 is attached to the busbar adapter 10''' via another top hat rail adapter 116' (only shown in FIG. 10B).

The modular block device 214 may further comprise electronics implementing one or more functions such as implementing one or more communication interfaces like a wireless interface (WiFi™, Bluetooth®, ZigBee™, NFC) and/or a wired interface (USB, Ethernet), a display, for example a LCD, OLED display for displaying information like a status, power related information etc.

Yet further, the modular block device 214 may comprise an undervoltage release, a shunt current release, and/or an auxiliary switch. Thus, the functionality of the motor starter combination attached to the busbar adapter may be further extended, e.g. by further protection functions (undervoltage, shunt current release) and communication functions (auxiliary switch).

In principle, further functionality may be implemented by the modular block device 214 by integrating further electronics and/or adding it with additional software to a firmware implemented by a controller integrated for example in the device 214. For example, the device 214 may comprise a controller and a rewritable non-volatile memory such as a flash programmable memory. The memory may store a firmware implementing the functionality of the device 214 such as controlling an integrated display and the communication via an integrated communication interface. The firmware may be updated via the busbar adapter 10''' or via an interface of device 214.

The busbar adapter 10''' comprises at its bottom the connector contacts 108, 108', 108", respectively, each of which is provided for contacting a bar of a busbar when the adapter 10 is attached to that busbar. In addition to the connector contacts 108, 108', 108", further contacts 109 are provided. These contacts 109 are used for transmitting to the busbar, to which the busbar adapter 10''' is attached, and/or receiving from the busbar a control current and transmitting to and/or receiving from the busbar one or more data signals containing information. For example, the measurements made with the at least one electric current sensor of the busbar adapter 10''' may be transmitted via the contacts 109 as a data signal via the busbar to a device, which is also connected to the busbar and provided to receive the data signal and to process the measurements contained in the received data signal. Also, one or more control currents may be generated by a device connected to the busbar and transmitted to the busbar adapter 10''' via the busbar and the contacts 109. The one or more control currents may be processed by the electronics of the busbar adapter 10''' and/or transmitted to devices attached to the busbar adapter 10''', for example to control a switch or a relay.

The contacts 109 may be arranged at the bottom of the busbar adapter 10''' such that they contact one or more bars different from the bars, which are contacted by the connector contacts 108, 108', 108", for example one or more bars provided in a busbar to transmit control currents and/or data signals. For example, a busbar board may have different lines of sockets for plugging the connector contacts 108, 108', 108" into. One or more further line of sockets may be provided for plugging the contacts 109 into. The socket lines may be arranged in parallel on the busbar board so that the connector contacts 108, 108', 108" arranged in offset at the bottom side of the busbar adapter 10''' each may be plugged into a socket of a different line, and also the contacts 109 may be arranged in offset to the contacts 108, 108', 108" at the bottom side of the busbar adapter 10".

The invention claimed is:

1. A busbar adapter comprising:
    a housing being adapted to be attached to a busbar,
    a printed circuit board,
    at least one electric current sensor electrically connected with the printed circuit board, and
    electronics, and
    wherein the printed circuit board and the at least one electric current sensor are arranged inside the housing,
    wherein the housing comprises an upper housing part being adapted for the attachment of one or more devices to be connected through the busbar adapter to the busbar and a lower housing part being adapted for holding the printed circuit board and the at least one electric current sensor,
    wherein the lower housing part comprises a first part being adapted for holding the printed circuit board and the at least one electric current sensor and a second part being adapted to be attached to the busbar,
    wherein the electronics are configured to implement one or more energy metering related functions based on measurements made with the at least one electric current sensor, and
    wherein the energy metering function implemented by the electronics comprises generating power and energy data from the measurements made with the at least one electric current sensor and providing the power and energy data for further processing.

2. The busbar adapter of claim 1, wherein the at least one electric current sensor comprises a Rogowski coil, which is wrapped around an electrical conductor carrying an electric current from a bar of the busbar.

3. The busbar adapter of claim 1, wherein the housing comprises a surface adapted for the attachment of one or more devices to be connected through the busbar adapter to the busbar.

4. The busbar adapter of claim 3, wherein the surface comprises at least one rail being provided for attaching one or more devices on the surface.

5. The busbar adapter of claim 1, wherein the upper housing part comprises one or more contacts being electrically connected to the busbar and being provided to be electrically connected to one or more respective contacts of a device being attached to the busbar adapter.

6. The busbar adapter of claim 1, wherein the electronics comprises a wired and/or wireless interface for providing the power and energy data to external devices.

7. The busbar adapter of claim 1, wherein the electronics comprises a controller for processing the power and energy data, particularly for analyzing and/or evaluating the power and energy data, wherein the controller is particularly configured to detect an overload condition and/or a short circuit from the processing of the data and to generate a signal for activating a protection device depending on the detection of the overload condition or the short circuit.

8. An arrangement comprising:
the busbar adapter of claim 7,
at least one device, particularly an electric switching device, being adapted to be attached to the busbar adapter of claim 7, wherein the electric switching device fastens the electrical switching device on the surface, particularly on at least one rail provided on the surface, and at least one of the following: an undervoltage release; a shunt current release; an auxiliary switch,
wherein the device being attached to the busbar adapter for connecting to the busbar, and
a relay being controlled by the controller depending on the processing of the data, wherein the controller is configured to detect the overload condition and/or the short circuit from the processing of the data and to activate the relay in case of the detected overload condition or the detected short circuit.

9. An electric device, particularly an electric switching device, being adapted to be attached to the busbar adapter of claim 1, wherein the electric switching device fastens the electric switching device on the surface, particularly on at least one rail provided on the surface, and at least one of the following: an undervoltage release; a shunt current release; an auxiliary switch.

10. An arrangement comprising:
the busbar adapter of claim 1, and
at least one device, particularly an electric device, particularly an electric switching device, being adapted to be attached to the busbar adapter,
wherein the electric switching device fastens the electrical switching device on a surface, particularly on at least one rail provided on the surface, and at least one of the following: an undervoltage release; a shunt current release; an auxiliary switch, wherein the electric switching device is attached to the busbar adapter for connecting to the busbar,
wherein a motor starter combination of devices is attached to the busbar adapter.

11. The arrangement of claim 10, comprising the busbar adapter, electronics comprises a controller for processing power and energy data, particularly for analyzing and/or evaluating the power and energy data, wherein the controller is particularly configured to detect an overload condition and/or a short circuit from the processing of the data and to generate a signal for activating a protection device depending on the detection of the overload condition or the short circuit; and,
a relay being controlled by the controller depending on the processing of the data, wherein the controller is configured to detect the overload condition and/or the short circuit from the processing of the data and to activate the relay in case of the detected overload condition or the detected short circuit.

* * * * *